(12) United States Patent
Venkatraman et al.

(10) Patent No.: US 8,697,560 B2
(45) Date of Patent: Apr. 15, 2014

(54) PROCESS OF FORMING AN ELECTRONIC DEVICE INCLUDING A TRENCH AND A CONDUCTIVE STRUCTURE THEREIN

(75) Inventors: Prasad Venkatraman, Gilbert, AZ (US); Balaji Padmanabhan, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1 day.

(21) Appl. No.: 13/404,855

(22) Filed: Feb. 24, 2012

(65) Prior Publication Data

US 2013/0221428 A1 Aug. 29, 2013

(51) Int. Cl.
*H01L 21/3205* (2006.01)

(52) U.S. Cl.
USPC .................. 438/589; 438/587; 257/E21.384

(58) Field of Classification Search
USPC .................................. 438/259, 589, 587, 588
See application file for complete search history.

(56) References Cited

U.S. PATENT DOCUMENTS

| | | | |
|---|---|---|---|
| 5,998,833 A | 12/1999 | Baliga | |
| 6,501,129 B2 | 12/2002 | Osawa | |
| 6,649,975 B2 | 11/2003 | Baliga | |
| 6,710,403 B2 | 3/2004 | Sapp | |
| 6,853,033 B2 | 2/2005 | Liang et al. | |
| 6,991,977 B2 | 1/2006 | Kocon | |
| 7,282,765 B2 | 10/2007 | Xu et al. | |
| 7,345,342 B2 | 3/2008 | Challa et al. | |
| 7,745,846 B2 | 6/2010 | Korec et al. | |
| 7,843,004 B2 | 11/2010 | Darwish | |
| 7,851,312 B2 | 12/2010 | Grivna | |
| 7,982,265 B2 | 7/2011 | Challa et al. | |
| 2008/0073707 A1 | 3/2008 | Darwish | |
| 2009/0140327 A1 | 6/2009 | Hirao et al. | |
| 2010/0123192 A1* | 5/2010 | Burke et al. | 257/334 |
| 2010/0187602 A1 | 7/2010 | Woolsey et al. | |
| 2011/0039384 A1 | 2/2011 | Darwish | |

OTHER PUBLICATIONS

U.S. Appl. No. 13/170,033, filed Jun. 27, 2011, "Method of Making an Insulated Gate Semiconductor Device and Sturcture", Inventors: Peter A. Burke et al.
Rutter, Steve T. Peake, "Low Voltage Trench/MOS Combining Low Specific Rds(on) and Qg FOM", in Proc ISPSD 2010, pp. 325-328.
U.S. Appl. No. 13/404,895, filed Feb. 24, 2012, " Electronic Device Including a Trench and a Conductive Structure Therein and a Process of Forming The Same", Inventors: Zia Hossain et al.

* cited by examiner

*Primary Examiner* — Reema Patel
(74) *Attorney, Agent, or Firm* — Abel Law Group, LLP

(57) ABSTRACT

An electronic device can include a transistor structure, including a patterned semiconductor layer overlying a substrate and having a primary surface, wherein the patterned semiconductor layer defines a first trench and a second trench that extend from the primary surface towards the substrate. The electronic device can further include a first conductive electrode and a gate electrode within the first trench. The electronic device can still further include a second conductive electrode within the second trench. The electronic device can include a source region within the patterned semiconductor layer and disposed between the first and second trenches. The electronic device can further include a body contact region within the patterned semiconductor layer and between the first and second trenches, wherein the body contact region is spaced apart from the primary surface. Processes of forming the electronic device can take advantage of forming all trenches during processing sequence.

20 Claims, 12 Drawing Sheets

PROCESS OF FORMING AN ELECTRONIC DEVICE INCLUDING A TRENCH AND A CONDUCTIVE STRUCTURE THEREIN

FIELD OF THE DISCLOSURE

The present disclosure relates to electronic devices and processes of forming electronic devices, and more particularly to, electronic devices including trenches and conductive structures therein and processes of forming the same.

RELATED ART

Metal-oxide-semiconductor field-effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

In optimizing the performance of a MOSFET, a designer is often faced with trade-offs in device parameter performance. Specifically, available device structure or fabrication process choices may improve one device parameter, but at the same time such choices may degrade one or more other device parameters. For example, available structures and processes that improve figure of merit, that is, on-resistance times total gate charge of a MOSFET, may increase the size of the die, and smaller die size may have a higher figure of merit.

BRIEF DESCRIPTION OF THE DRAWINGS

Embodiments are illustrated by way of example and are not limited in the accompanying figures.

Figure 1:
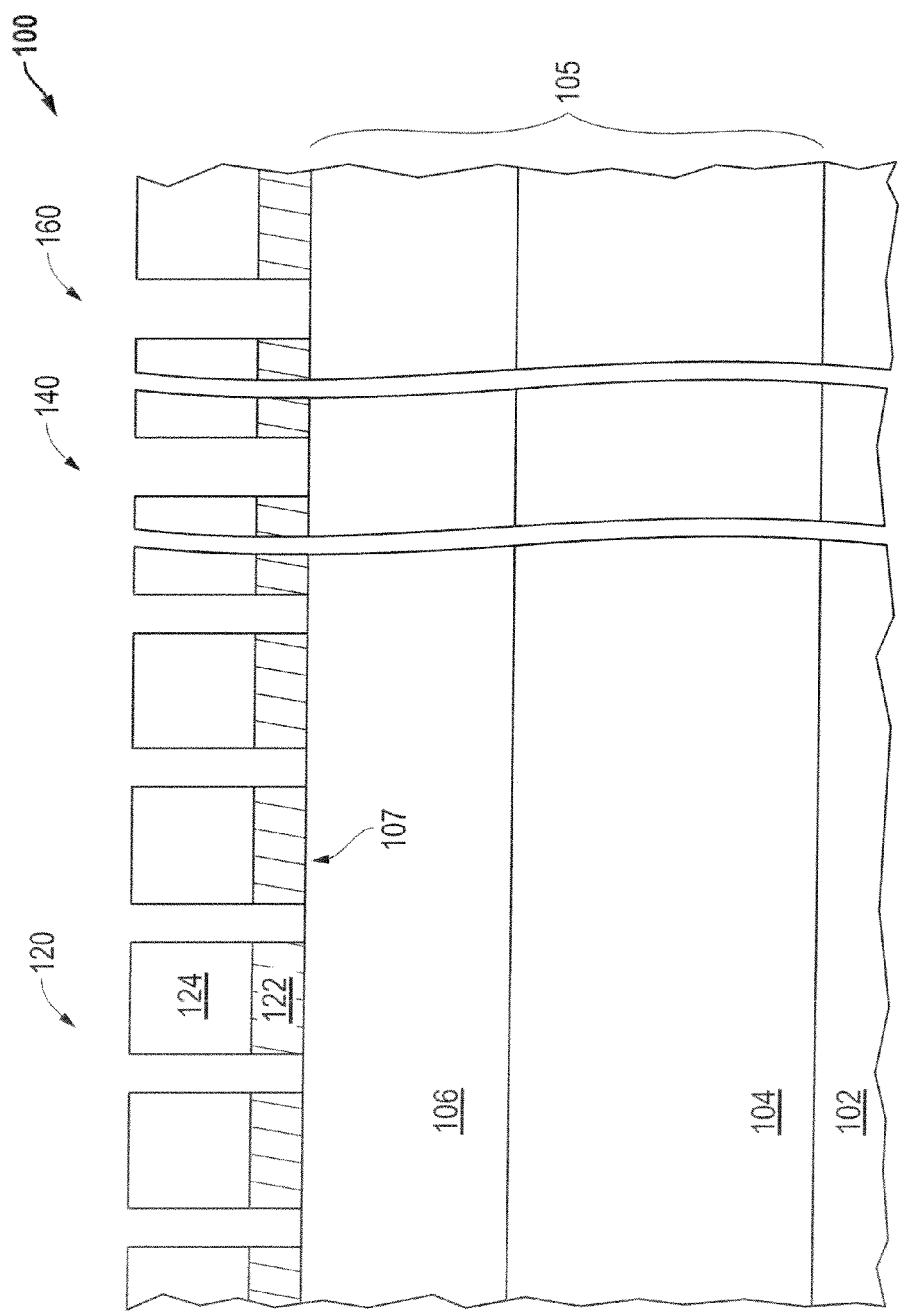
FIG. 1 includes an illustration of a cross-sectional view of a portion of a workpiece that includes an underlying doped region, semiconductor layers, a hardmask layer, and a patterned resist layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the term "channel length" is intended to mean the distance between a source region and a drain region of a transistor structure that is measured substantially parallel to the current flow through a channel region during normal operation. The term "channel width" is intended to mean a dimension of the channel region that is measured in a direction orthogonal to the channel length.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include trenches within an active area where half of the gate electrodes within the trenches are removed and replaced by conductive structures that allow better depletion properties. The fewer gate electrodes help to reduce total gate charge ($Q_G$) and help to provide a lower figure of merit, which is a product of the on-resistance ($R_{DSON}$) times $Q_G$, as compared to conventional electronic devices including trench power MOSFETs. Therefore, the performance of the electronic device is significantly improved. Compared to conventional electronic devices that include lateral power MOSFETs, the electronic devices as described herein can provide a smaller die size and allow more flexibility in choosing a package for the electronic device. The benefits and details of the electronic device are better understood after reading the embodiments as described in detail below.

FIG. 1 includes an illustration of a cross-sectional view of a portion of a workpiece 100 that includes an active area 120 where transistor structures will be formed, a gate feed area 140, and a conductive electrode contact area 160. The workpiece 100 includes an underlying doped region 102 that is part of a substrate that may be lightly doped or heavily doped, n-type or p-type. For the purposes of this specification, heavily doped is intended to mean a peak dopant concentration of at least $10^{19}$ atoms/cm$^3$. The underlying doped region 102 can be a portion of a heavily doped substrate (e.g., a heavily n-type doped wafer) or may be a buried doped region overlying a base layer of opposite conductivity type or overlying a buried insulating layer (not illustrated) that lies between the base layer and the buried doped region. In an embodiment, the underlying doped region 102 is heavily doped with an n-type dopant, such as phosphorus, arsenic, antimony, or any combination thereof. In a particular embodiment, the underlying doped region 102 includes arsenic or antimony if diffusion of the underlying doped region 102 is to be kept low.

In the embodiment illustrated in FIG. 1, the semiconductor layer 104 overlies the underlying doped region 102 and can include a Group 14 element (for example, carbon, silicon, germanium, or any combination thereof) and any of the dopants as described with respect to the underlying doped region 102 or dopants of the opposite conductivity type. In an embodiment, the semiconductor layer 104 is a moderately doped n-type or p-type epitaxial silicon layer having a thickness in a range of approximately 0.5 microns to approximately 4.0 microns, and a doping concentration no greater than approximately $10^{18}$ atoms/cm$^3$, and in another embodiment, a doping concentration of least approximately $10^{16}$ atoms/cm$^3$.

The workpiece 100 can further include another semiconductor layer 106 that overlies the semiconductor layer 104. The semiconductor layer 106 can include a Group 14 element (i.e., carbon, silicon, germanium, or any combination thereof) and any of the dopants as described with respect to the semiconductor layer 104. In an embodiment, the semiconductor layer 106 is a lightly doped n-type or p-type epitaxial silicon layer having a thickness in a range of approximately 0.5 microns to approximately 3.0 microns, and a doping concentration no greater than approximately $10^{17}$ atoms/cm$^3$, and in another embodiment, a doping concentration of least approximately $10^{15}$ atoms/cm$^3$. The doping concentration of the semiconductor layer 106 at this point in the process flow may be referred to as the background doping concentration. The semiconductor layer includes a primary surface 107 that is spaced apart from underlying doped region. The combination of the semiconductor layers 104 and 106 are illustrated as semiconductor 105 in subsequent figures.

A hardmask layer 122 and a resist layer 124 are formed over the semiconductor layer 106. The hardmask layer 122 is used as a masking layer during a subsequent trench etch. The hardmask layer 122 can include an oxide, a nitride, an oxynitride, or any combination thereof. In an embodiment, the hardmask layer 122 can include a single film or a plurality of films (for example, an oxide film covered by a nitride film). The hardmask layer 122 has a thickness sufficient to withstand the subsequent trench etch, and in an embodiment has a thickness in a range of approximately 110 nm to approximately 900 nm. The hardmask layer 122 can be formed using a thermal growth technique, a deposition technique, or a combination thereof. A resist layer 124 is formed over the hardmask layer 122 and is patterned to form openings corresponding to locations where trenches will be subsequently formed. An etch is performed to pattern the hardmask layer 122 as illustrated in FIG. 1. The resist layer 124 is then removed.

Figure 2:
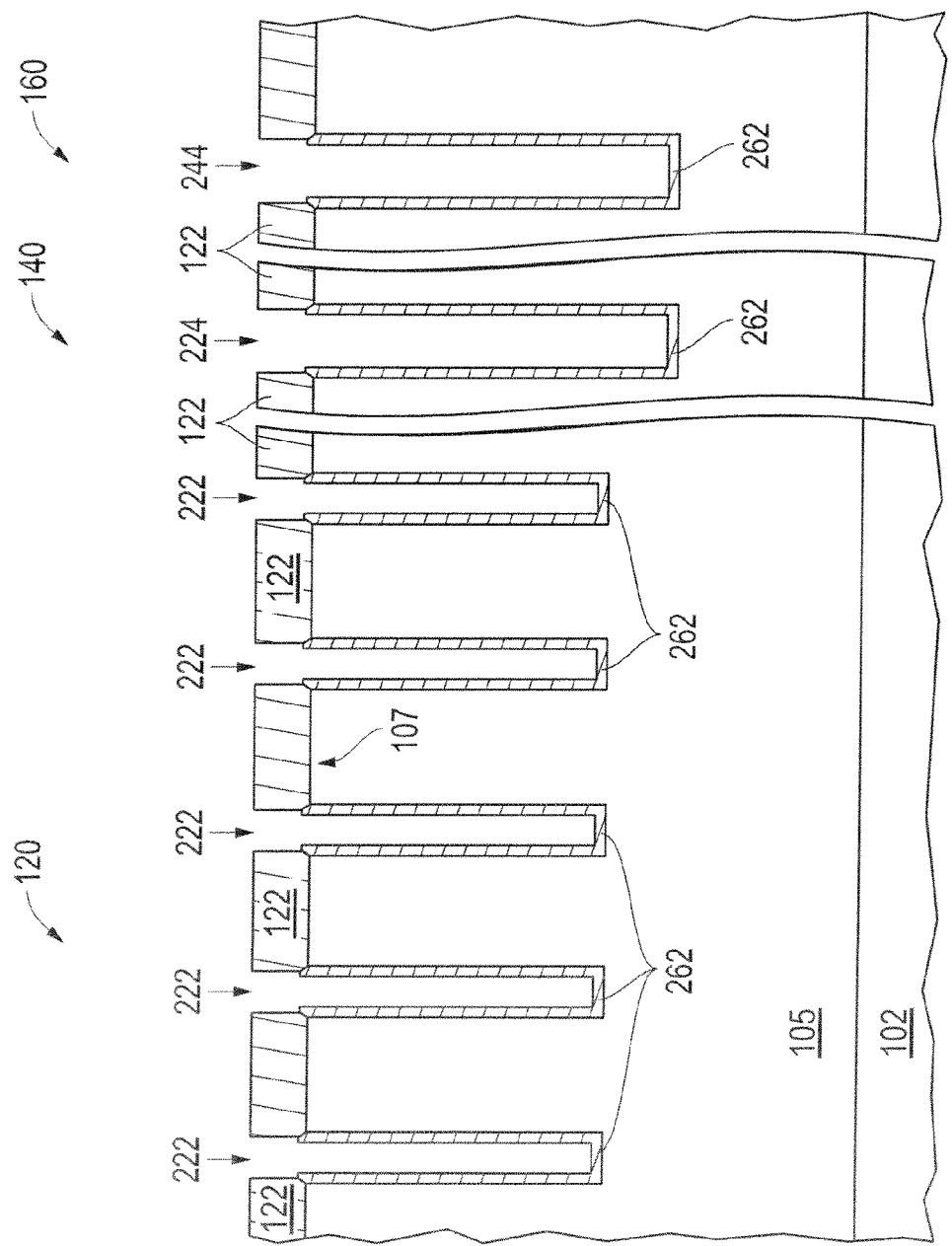
FIG. 2 includes an illustration of a cross-sectional view of the workpiece of FIG. 1 after forming trenches and an insulating layer within the trenches.

In FIG. 2, the semiconductor layer 105 is etched to define trenches 222, 224, 242, and 244 that extend from the primary surface 107 towards the underlying doped region 102. Trenches 222 and 242 are at locations where transistor structures will be formed, and trenches 224 and 244 are at locations where a gate feed area and a conductive electrode contact area will be formed. The trenches 222, 224, 242, and 244 have depths in a range approximately 1.1 to approximately 5.2 microns. In another embodiment, the trenches can extend to a depth that is in a range of approximately 25% to approximately 75% of the thickness of the semiconductor layer 105. The widths of the trenches 222, 224, 242, and 244 may be a range of approximately 0.1 micron to approximately 0.9 micron. In an embodiment, the trenches 222 and 242 are narrower than the widths of the trenches 224 and 244. In another embodiment, the trenches 242 are narrower than the trenches 222. The trenches 222, 224, 242, and 244 can have substantially the same depth or may have different depths as illustrated in FIG. 2. If needed or desired, a thermal oxide 262 may be grown to help round the corners of the trenches 222, 224, 242, and 244 near the primary surface 107 and bottoms of the trenches 222, 224, 242, and 244. The hardmask layer 122 and the thermal oxide 262 are removed.

Figure 3:
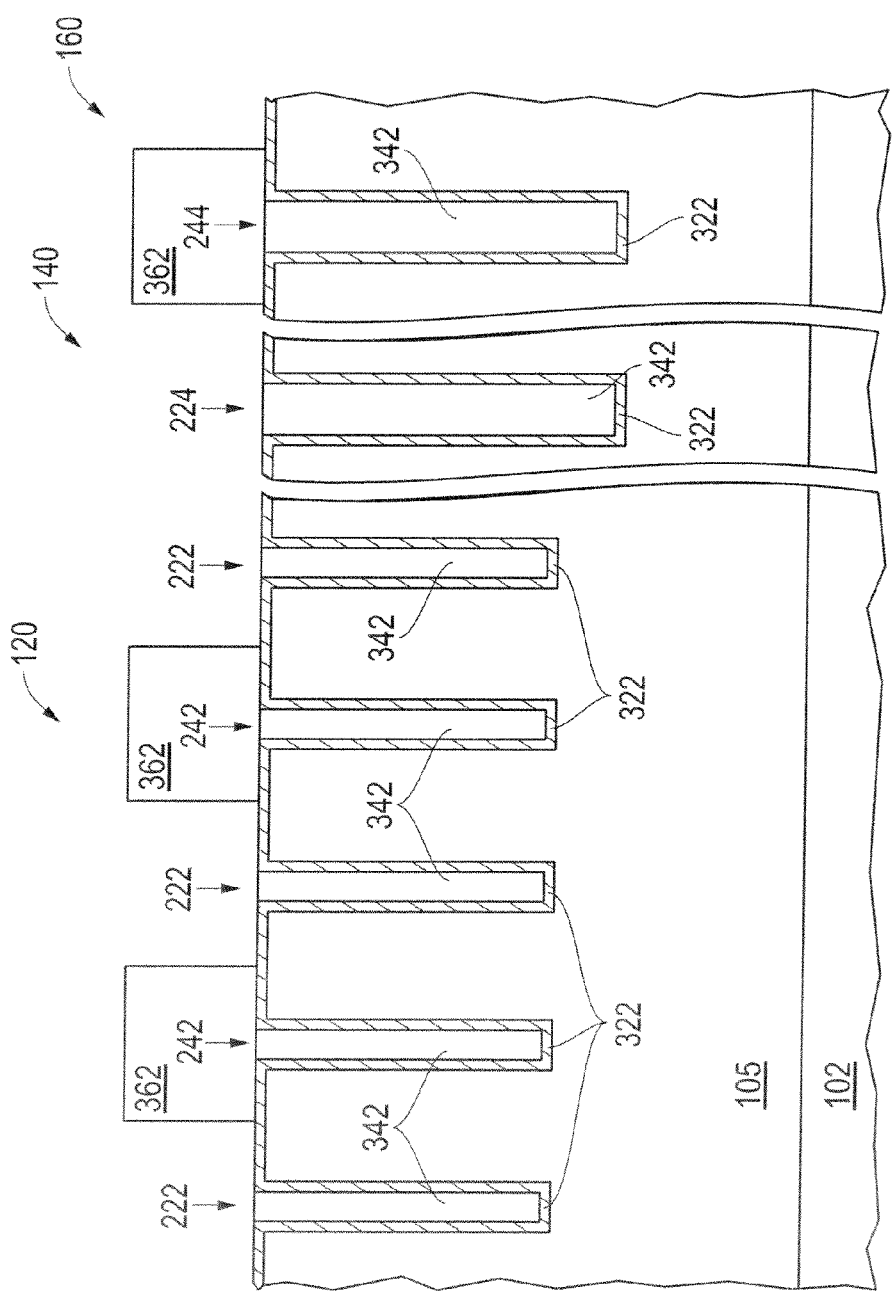
FIG. 3 includes an illustration of a cross-sectional view of the workpiece of FIG. 2 after forming conductive structures within the trenches and a patterned resist layer over some of the conductive structures and trenches.

FIG. 3 includes an illustration of a cross-sectional view after forming an insulating layer 322, conductive structures 342, and a patterned resist layer 362. The insulating layer 322 is formed along exposed portions of the semiconductor layer 105. The insulating layer 322 partly, but does not completely, fill the trenches 222, 224, 242, and 244. The insulating layer 322 can include an oxide, a nitride, or an oxynitride. In an embodiment, the insulating layer 322 can include a single insulating film, and in another embodiment, the insulating layer 322 can include a plurality of insulating films. For a device with a 30V $BV_{DSS}$, the insulating layer 322 has a thickness in a range of approximately 70 nm to approximately 150 nm. For a higher $BV_{DSS}$, the thickness of insulating layer 322 can be increased. The insulating layer 322 can be grown, deposited, or a combination thereof.

A conductive layer is formed over the insulating layer 322 and within the trenches 222, 224, 242, and 244. The conductive layer substantially fills the trenches 222, 224, 242 and 244. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, a refractory silicide, such as tungsten silicide, titanium silicide, or the like, or a refractory metal-semiconductor-nitride, such as TaSiN; and the conductive fill material can include tungsten. In a more particular embodiment, the conductive layer can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

A portion of the conductive layer that overlies the insulating layer 322 outside of the trenches 222, 224, 242, and 244 is removed to form conductive structures 342 within the trenches 222, 224, 242, and 244, as illustrated in the embodiment of FIG. 3. The removal can be performed using a chemical-mechanical polishing or blanket etching technique. The insulating layer 322 may be used as a polish-stop or etch-stop layer. A resist layer is formed over the insulating layer 322 and conductive structures 342 and patterned to form the patterned resist layer 362 that overlies the trenches 242 and 244 and conductive structures 342 within such trenches.

Figure 4:
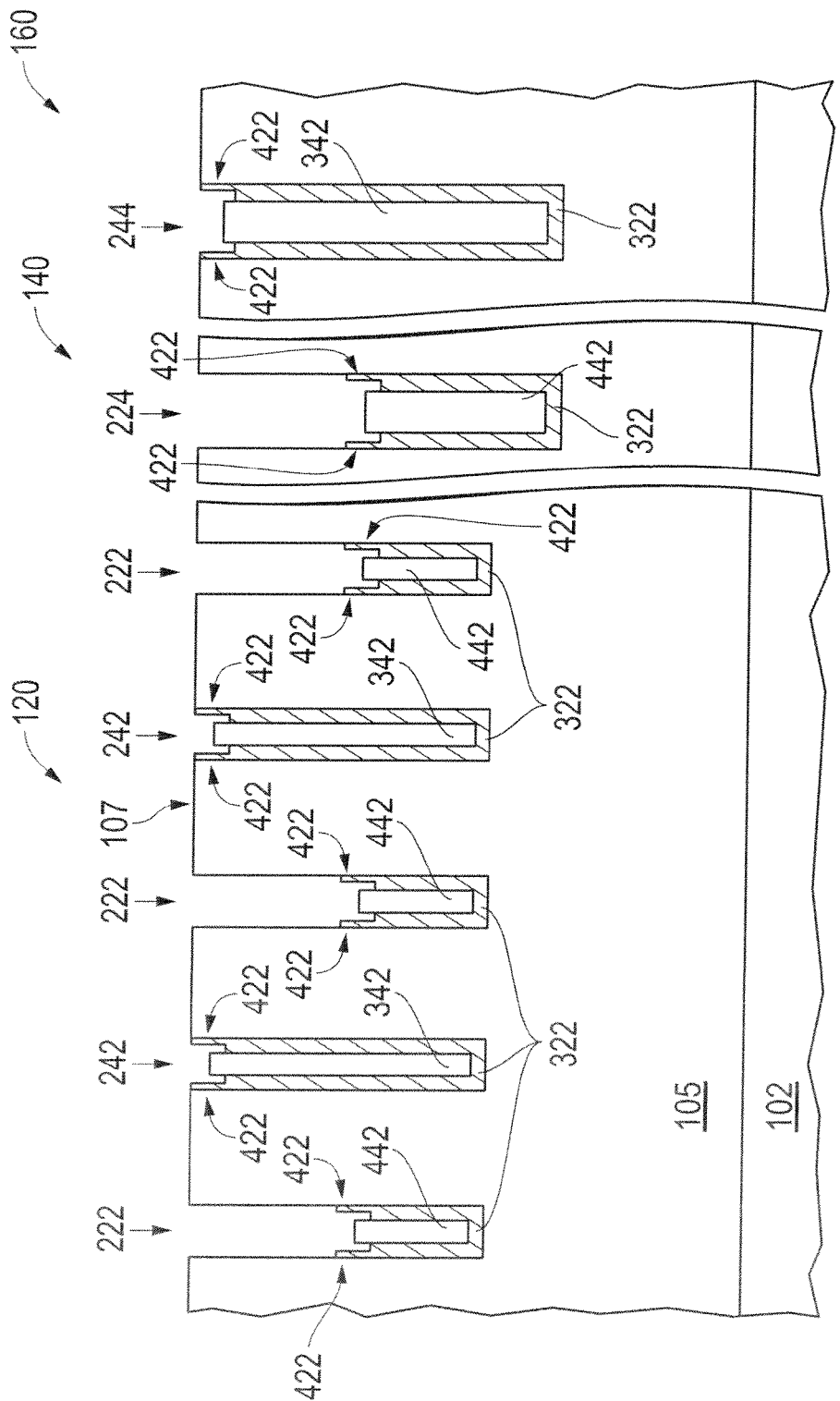
FIG. 4 includes an illustration of a cross-sectional view of the workpiece of FIG. 3 after removing portions of some of the conductive structures and forming insulating stubs.

The exposed portions of the conductive structures 342 within the trenches 222 and 224 are recessed to form conductive structures 442 within the trenches 222 and 224, as illustrated in FIG. 4. The removal may be performed using a wet or dry etching technique. The patterned resist layer 362 is then removed. Some of the exposed portions of the insulating layer 322 can be removed; however, the semiconductor layer 105 remains protected by remaining portions of the insulating layer 322. The conductive structures 342 and 442 are recessed within the trenches 222, 224, 242, and 244. The highest elevations of the conductive structures 342 and 442 lie below an elevation of the primary surface 107. The tops of the conductive structures 342 can be in a range of approximately 0.1 to 0.2 microns below the primary surface 107, and the tops of the conductive structures 442 can be approximately 0.45 micron to approximately 1.3 microns below the primary surface 107. When expressed as a percentage of a depth of a corresponding trench (that is, the trench in which a particular conductive structure is disposed), the conductive structures 342 can be in a range of approximately 70% to approximately 99% of the depth of their corresponding trenches, and the conductive structures 442 can be in a range of approximately 30 to 60% of the depths of their corresponding trenches. As will be subsequently described, the tops of the conductive structures 442 are designed to be at elevations below subsequently-formed body regions, and the tops of the conductive structures 342 are at elevations within or higher than a subsequently-formed body region. A combination of the conductive structures 342 and 442 can be part of a conductive electrode to help deplete more fully the portions of semiconductor layer 105 between the trenches 222 and 242 within the active area.

The portions of the insulating layer 322 that were previously thinned are removed to expose portions of the semiconductor layer 105, as illustrated in FIG. 4. Due to the sequence of removals with respect to the insulating layer 322, insulating stubs 422 that are parts of the remaining insulating layer 322 are formed within the trenches 222, 224, 242, and 244. For the trenches 222 and 224, the insulating stubs 422 can help to reduce capacitive coupling between the subsequently-formed gate members and portions of the semiconductor layer 105 that are parts of the drain region. The reduced capacitive coupling helps to reduce the drain component ($Q_{GD}$) of $Q_G$ and can allow for the transistor structures to switch states (off-to-on or on-to-off) more quickly. If needed or desired, a sacrificial oxide can be grown and removed from the semiconductor layer 105. When the conductive structures 442 include heavily doped polysilicon or amorphous silicon and the semiconductor layer 105 includes single crystal silicon, the conductive structures 442 oxidize faster compared to the semiconductor layer 105 that helps to leave some oxide on conductive structures 442. This results in an increased oxide thickness on conductive structures 442 after the subsequently grown gate oxide.

Figure 5:
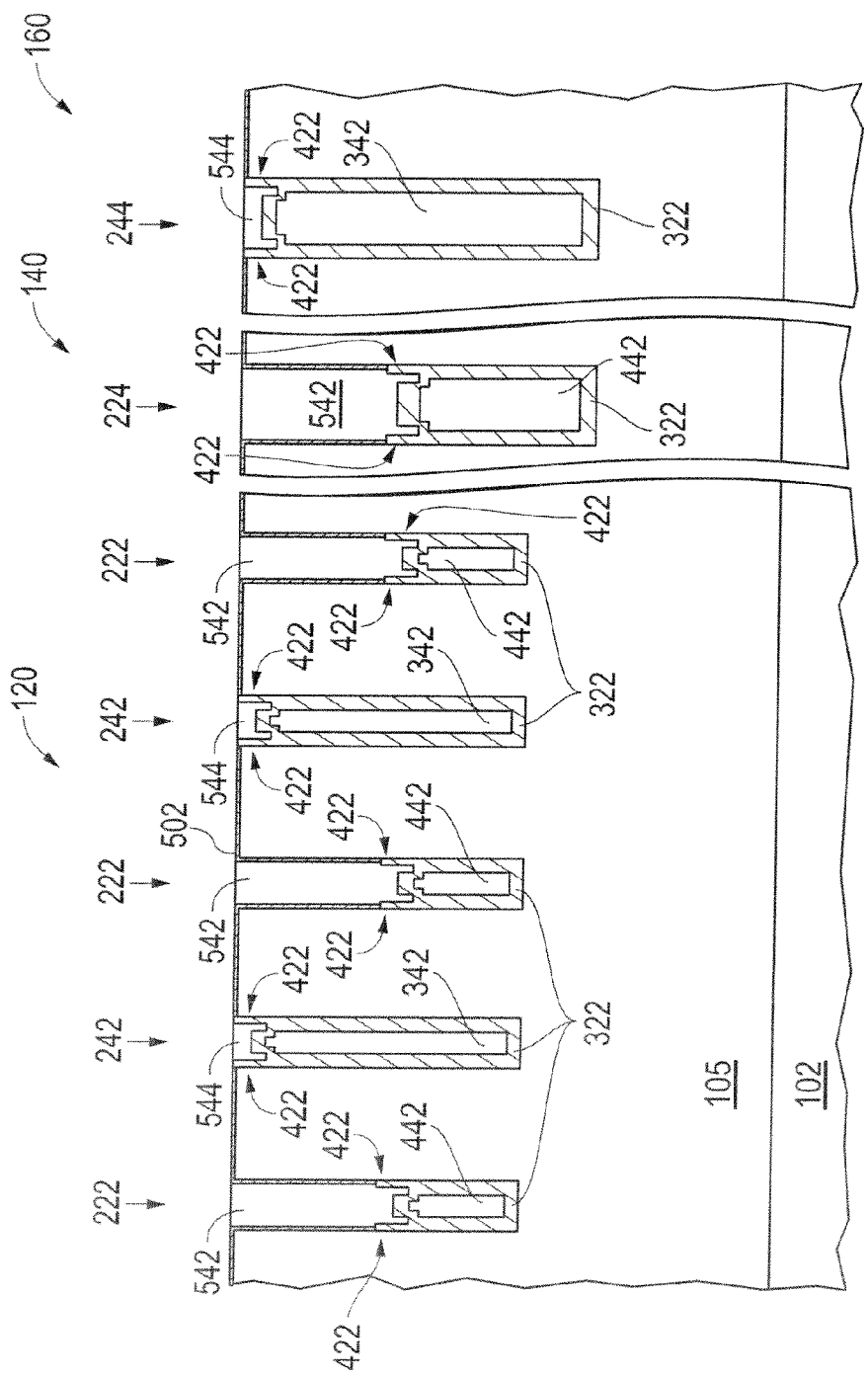
FIG. 5 includes an illustration of a cross-sectional view of the workpiece of FIG. 4 after forming a gate dielectric layer and gate members.

FIG. 5 includes an illustration of the workpiece after forming a gate dielectric layer 502, gate members 542, and conductive structures 544. The gate dielectric layer 502 can include an oxide, a nitride, an oxynitride, or any combination thereof. In an embodiment, the gate dielectric layer 502 can include a single film or a plurality of films (for example, an oxide film covered by a nitride film). The gate dielectric layer 502 can have a thickness in a range of approximately 11 nm to approximately 130 nm. The gate dielectric layer 502 can be formed using a thermal growth technique, a deposition technique, or a combination thereof.

A conductive layer is formed over the gate dielectric layer 502 and fills remaining portions of the trenches 222, 224, 242, and 244. The conductive layer can include any of the materials, number of films, and be formed using any of the techniques previously described with respect to the conductive layer when forming the conductive structures 342. The conductive layer that overlies the gate dielectric layer 502 may have the same or different composition, include the same number or a different number of films, or be formed with the same or different technique as compared to the conductive layer used to form the conductive structures 342. After reading this specification, skilled artisans will be able to determine the composition of the conductive layer to meet their needs or desires for a particular application.

A portion of the conductive layer that overlies the gate dielectric layer 502 outside of the trenches 222, 224, 242, and 244 is removed to form the gate members 542 within the trenches 222 and 224 and conductive structures 544 within the trenches 242 and 244, as illustrated in the embodiment of FIG. 5. The removal can be performed using a chemical-mechanical polishing or blanket etching technique. The gate dielectric layer 502 may be used as a polish-stop or etch-stop layer. The gate members 542 can include gate electrodes for the transistor structures. As can be seen in FIG. 5, the insulating stubs 442 help to displace the lower portions of the gate members 542 away from the semiconductor layer 105, and thus, capacitive coupling between the gate members 542 and portions of the drain region will be reduced. The conductive structures 544 are an artifact of the processing sequence and may be removed at a later processing operation.

Figure 6:
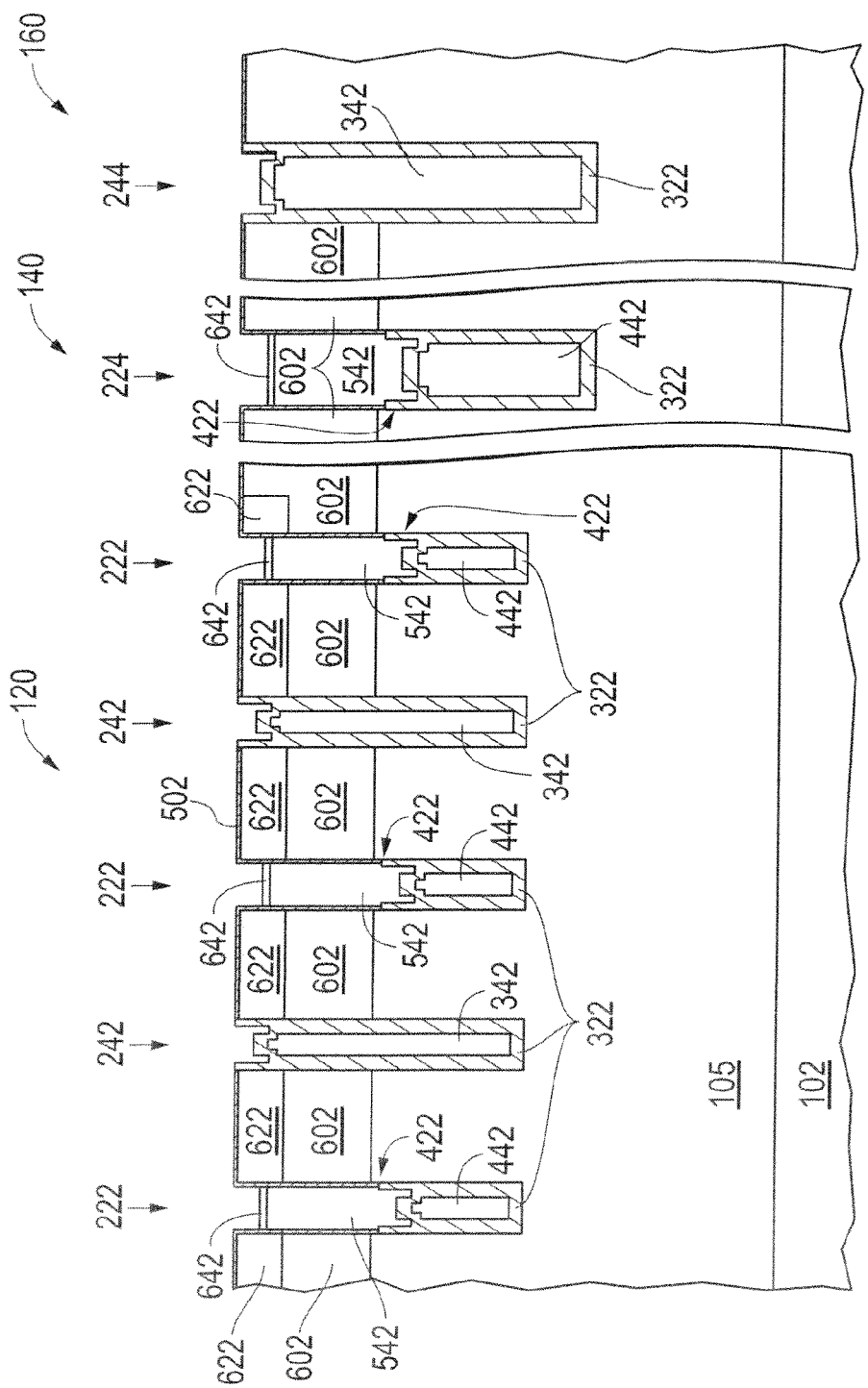
FIG. 6 includes an illustration of a cross-sectional view of the workpiece of FIG. 5 after forming body regions, source regions, and silicide members.

FIG. 6 includes an illustration of the workpiece after forming body regions 602, source regions 622, and silicide members 642. The body regions 602 include channel regions for the transistor structures. The body regions 602 have an opposite conductivity type as compared to the semiconductor layer 105. In an embodiment, within the active area, the elevations of the bottoms of the body regions 602 are above the elevations of the tops of the insulating stubs 442 within the trenches 222 and 224. In another embodiment, within the active area, the elevations of the bottoms of the body regions 602 are above the elevations lowermost points of the wider portions of the gate members 542, as illustrated in FIG. 6. The body regions 602 have peak dopant concentrations in a range of approximately $5 \times 10^{16}$ atoms/cm$^3$ to approximately $1 \times 10^{18}$ atoms/cm$^3$ and extend to depths approximately 0.2 micron to approximately 1.2 micron from the primary surface 107. The body regions 602 can be formed with a single implant or with a chain of implants. In another embodiment, the body regions 602 can be replaced with a single body region within the active area.

The source regions 622 are formed from portions of the semiconductor layer 105 and are disposed over portions of the body regions 602. The source regions 622 have the same conductivity type as compared to the semiconductor layer 105 and opposite that of the body regions 602. The source regions 622 have a peak dopant concentration of at least approximately $1 \times 10^{19}$ atoms/cm$^3$ and extend to depths approximately 0.05 micron to approximately 0.5 micron from the primary surface 107. The source regions 622 can be formed with an implant or another suitable technique. In another embodiment, the source regions 622 can be replaced with a single source region within the active area.

Portions of the gate members 542 and the conductive structures 544 (illustrated in FIG. 5) are removed. By recessing the gate members 542, capacitive coupling between the gate members 542 and the source regions 622 can be reduced and help to reduce the source component ($Q_{GS}$) of $Q_G$ and can allow for the transistor structures to switch states (off-to-on or on-to-off) more quickly. In the embodiment illustrated, silicide regions 642 are formed from or over the gate members 542. After the removal and within the active area, elevations corresponding to the tops of the gate members 542 are above elevations corresponding to the junctions between the body regions 602 and the source regions 622. In an embodiment, the tops of the gate members 542 are recessed approximately 0.03 micron to approximately 0.3 micron below the primary surface. The silicide regions may be omitted if needed or desired.

Figure 7:
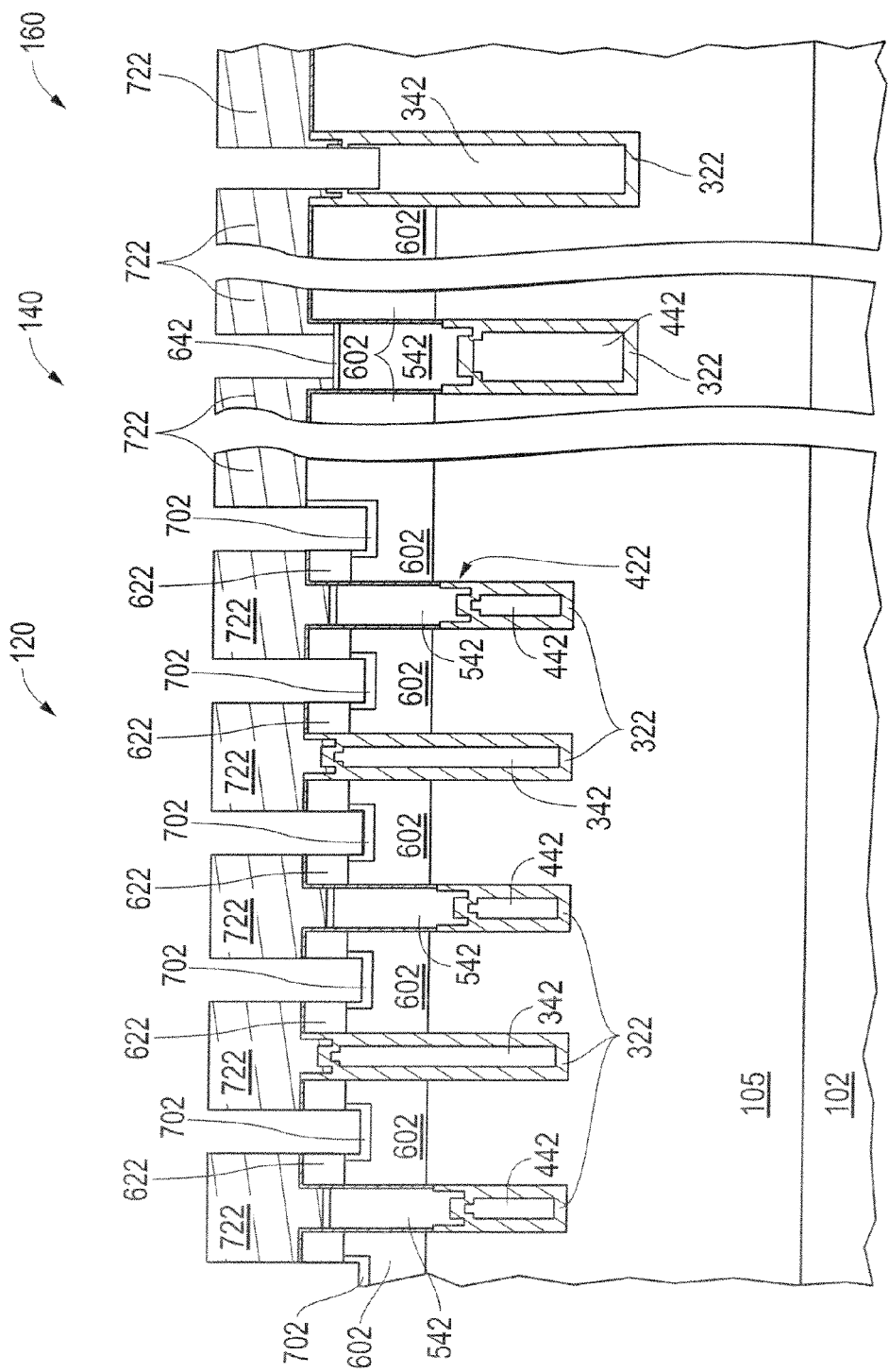
FIG. 7 includes an illustration of a cross-sectional view of the workpiece of FIG. 6 after forming an interlevel dielectric layer, contact openings, and body contact regions.

FIG. 7 includes an illustration of the workpiece after an interlevel dielectric ("ILD") layer 722 is formed and etched to define contact openings and after forming body contact regions 702. The ILD layer 722 is formed over the workpiece and can include an oxide, a nitride, an oxynitride, or any combination thereof. The ILD layer 722 can include a single film having a substantially constant or changing composition (for example, a high phosphorus content further from the semiconductor layer 105) or a plurality of discrete films. An etch-stop layer, an antireflective layer, or a combination may be used within or over the ILD layer 722 to help with processing. The ILD layer 722 may be planarized to improve process margin during subsequent processing operations (e.g., lithography, subsequent polishing, or the like). In an embodiment, the ILD layer 722 has a thickness in a range of approximately 300 nm to approximately 1000 nm. The ILD layer 722 can be planarized using an etchback or polishing technique.

The ILD layer 722 is patterned to define to define contact openings that extend through the ILD layer 722. An etch is performed to extend the contact openings though the source regions 622 within the active area. Within the gate feed area, the silicide region 642 can substantially prevent the underlying gate member 542 from being etched. Within the conductive electrode contact area, the conductive structure 342 is etched when the semiconductor layer 105 and conductive structure 342 include a similar material. For example, the conductive structure 342 may be etched when the semiconductor layer 105 includes monocrystalline silicon and the conductive structure 342 includes polycrystalline silicon. The conductive structure 342 may not be etched when the conductive structure 342 includes tungsten. The etch can be performed as a timed etch or as an endpoint detected etch with a timed overetch. The first endpoint may be detected when the source regions 622 become exposed, and a second endpoint may be detected by the presence of dopant from the body regions 602 in a particular embodiment. In the embodiment as illustrated, the contact openings are spaced apart from the trenches 222 and 242, and therefore, within the active area, the conductive structures 342 and the gate members 542 are not exposed within the contact openings.

Within the active area, the body contact regions 702 are formed by doping the bottom part of the contact opening. The body contact regions 702 may be implanted with a dopant having the same conductivity type as the body regions 602 in which they reside. The body contact regions 702 are heavily doped so that an ohmic contact can be subsequently formed. If needed or desired, exposed portions of the regions, structures, and members may be silicided. The gate feed area and the conductive electrode feed area can be covered with resist when forming the body contact regions 702, and the resist can be removed after the body contact regions 702 are formed.

Figure 8:
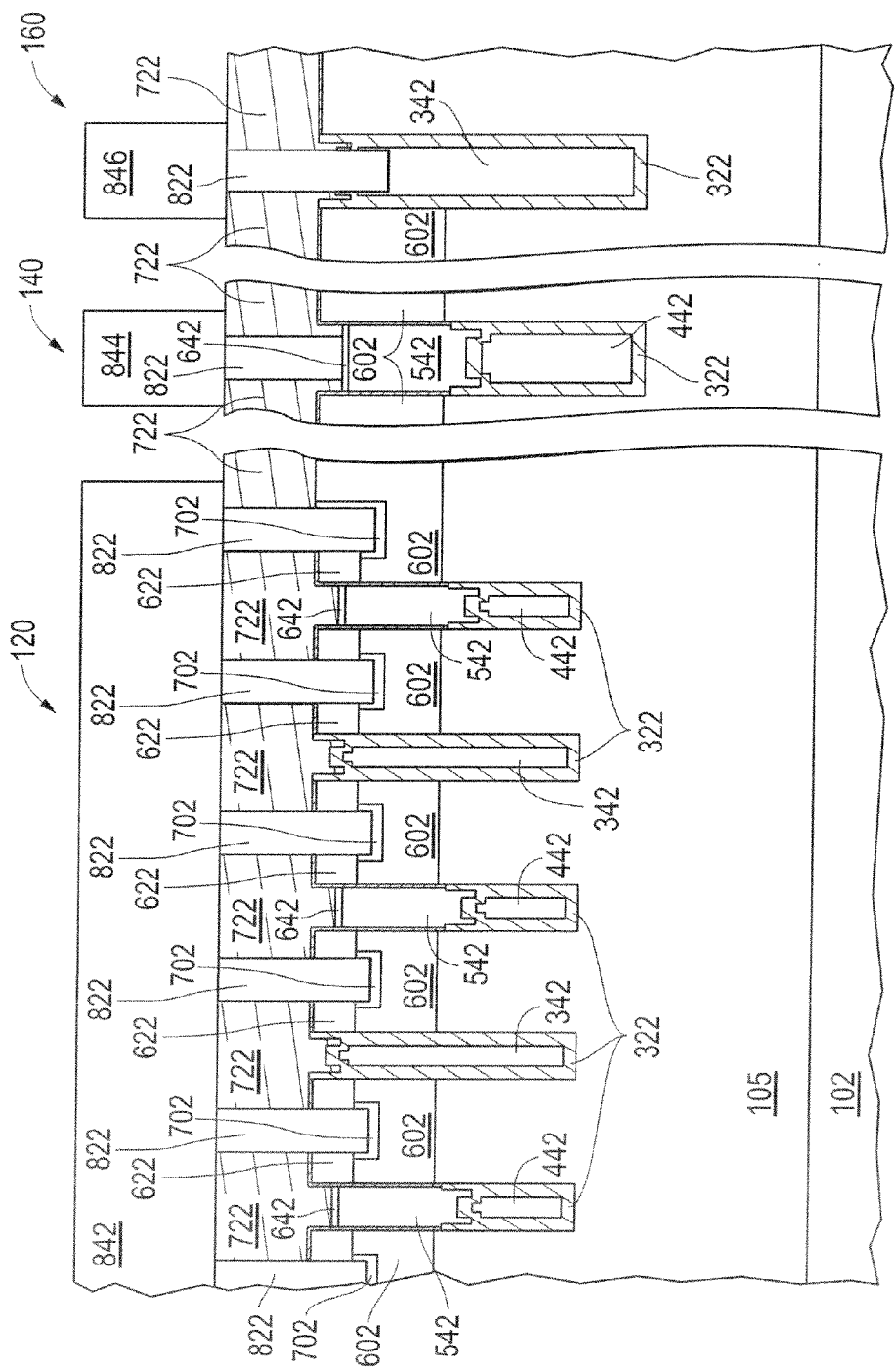
FIG. 8 includes an illustration of a cross-sectional view of the workpiece of FIG. 7 after forming a substantially completed electronic device.

FIG. 8 includes an illustration of a substantially completed electronic device. Conductive plugs 822 are formed by depositing a conductive layer and etching portions of the conductive layer outside the contact openings that extend through the ILD layer 722. The conductive layer for the conductive plugs 822 can include any of the materials, films, or both as described with respect to the conductive layer for the conductive structures 342. In an embodiment, the conductive plugs 822 are principally a transition metal, such as W. In an embodiment, the conductive layer for the conductive plugs 822 has substantially the same composition and same number of films as compared to the conductive structures 342. In another embodiment, the conductive layer for the conductive plugs 822 has a different composition or a different number of films as compared to the conductive structures 342. After removing portions of the conductive layer lying outside the contact openings, the conductive plugs 822 are formed. Other conductive plugs may be formed but are not illustrated in FIG. 8. Within the active area, the conductive plugs 822 electrically short the source regions 622 and the body contact regions 702 to each other.

An interconnect level can be formed and include interconnect members 842, 844, and 846. The interconnect member 842 is electrically connected to the conductive plugs 822 within the active area and to the source regions 622 and body contact regions 702. The interconnect member 844 within the gate feed area is electrically connected to the silicide region 642 and the gate member 542, which in turn is electrically connected to the gate members 542 within the active area. The interconnect member 846 within the conductive electrode area is electrically connected to the conductive plug 822 and conductive structure 342, which in turn is electrically connected to the conductive structures 342 and 442 within the active area. Although not illustrated, a drain contact may be formed to the backside of the workpiece to underlying doped region 102 or may be formed near the primary surface 107 if a topside contact is desired.

The interconnect members 842, 844, and 846 can be formed from a conductive layer can include any of the materials, films, or both as described with respect to the conductive layer for the conductive structures 342. In an embodiment, the conductive layer for the interconnect members 842, 844, and 846 has substantially the same composition and same number of films as compared to the conductive structures 342. In another embodiment, the conductive layer for the interconnect members 842, 844, and 846 can principally include aluminum, copper, or a noble metal. The thickness of the conductive layer can be in a range of approximately 0.5 micron to approximately 8.0 microns. The interconnect members are patterned using a resist layer and a lithographic technique.

The interconnect member 842 can be electrically connected to a source terminal, which during normal operation may be at $V_{SS}$ or approximately ground potential. The interconnect member 844 can be electrically connected to a gate terminal or a gate controller within the electronic device. The interconnect member 846 can be electrically connected to a substantially constant voltage terminal, which during normal operation may be at $V_{SS}$, $V_{DD}$ for logic transistors (e.g., higher than $V_{SS}$ and no greater than approximately 5 V), or ground potential. When the interconnect members 842 and 846 are to be at the same potential during normal operation, the interconnect members 842 and 846 can be electrically connected to each other or may be replaced by a single interconnect member having different portions within the active area and the conductive electrode area.

The electronic device can include many transistor structures substantially similar to the transistor structures illustrated in FIG. 8 with the transistor structures connected in parallel with their corresponding gate members connected to the gate terminal or gate controller. All of the transistor structures can be power transistors.

Figure 11:
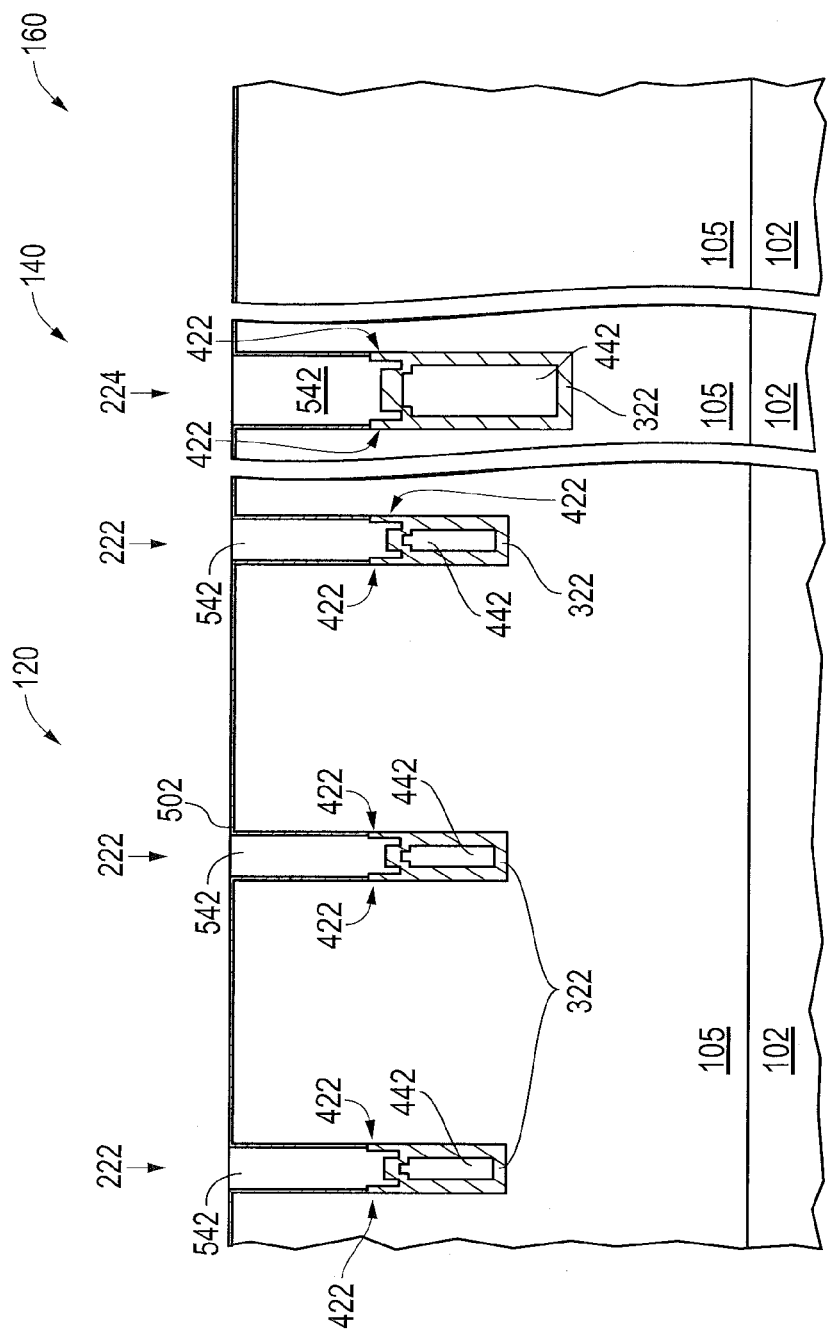
FIG. 11 includes an illustration of a cross-sectional view of an alternative embodiment of the workpiece of FIG. 5, where a first set of trenches are formed before a second set of trenches.
Figure 12:
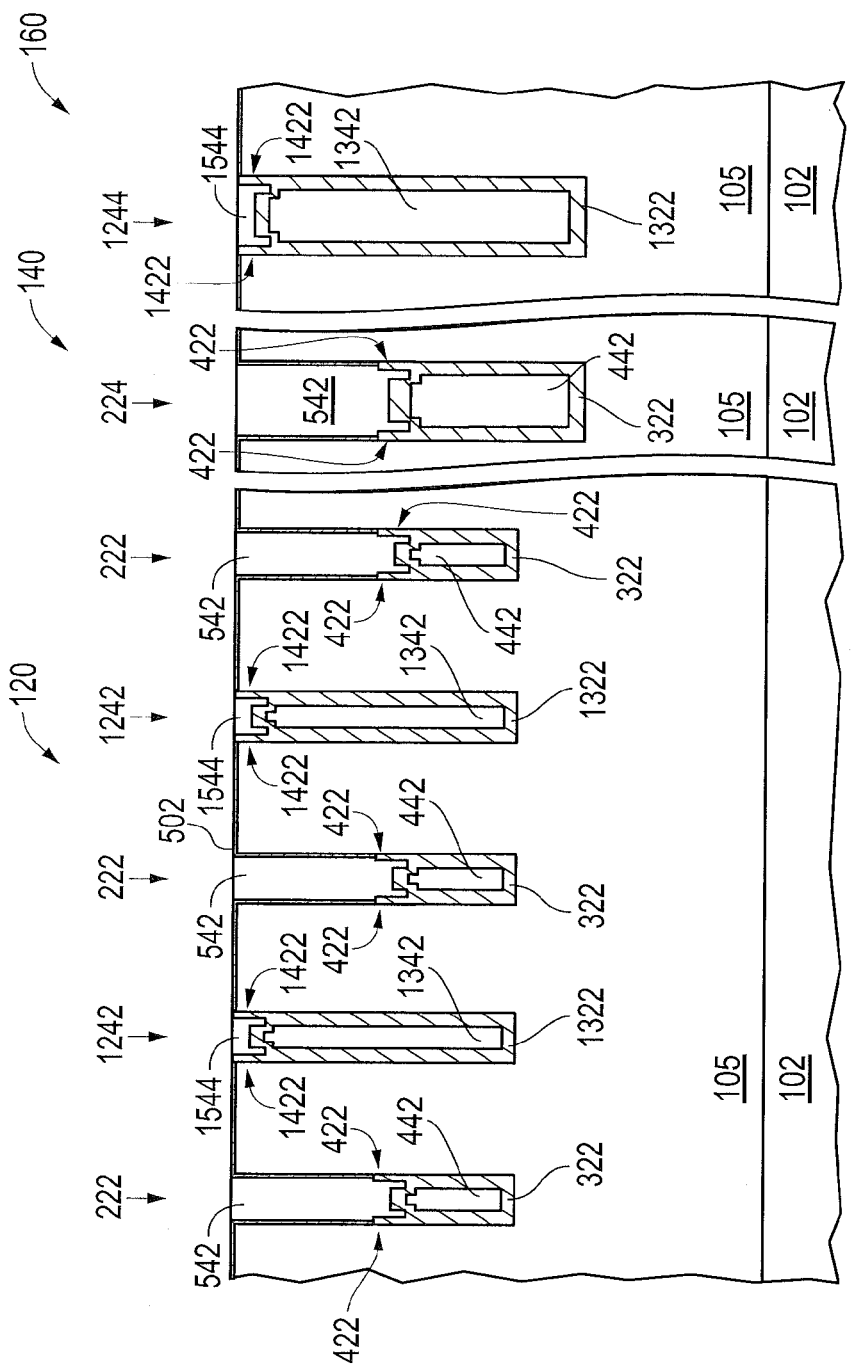
FIG. 12 includes an illustration of a cross-sectional view of the workpiece of FIG. 11 after forming the second set of trenches.

Many alternative embodiments may be used, some of which are addressed below to illustrate, and not limit, the scope the concepts as described herein. Within the active area, the trenches 242 may be formed at a different time as compared to the trenches 222, as illustrated in FIGS. 11 and 12. In FIG. 11, the insulating layer 322, the conductive structures 442, insulating stubs 422, and the gate member 542 are formed within trenches 222 and 224 using a process similar to the one illustrated in FIGS. 1 to 5. Referring to FIG. 11, the trenches 242 and 244 and corresponding features within the trenches 242 and 244 as illustrated in FIGS. 2 to 5 are not formed. After processing with respect to the trenches 222 and 224 is substantially completed, processing for the other trenches is performed. In FIG. 12, trenches 1242 and 1244 are formed and insulating layer 1322, conductive structures 1342 and 1544, and insulating stubs 1422 are formed within the trenches 1242 using a process similar to corresponding features as illustrated in FIGS. 2 to 5 with respect to trenches 242 and 244, the insulating layer 322, the conductive structures 342 and 544, and the insulating stubs 422. Different depths for the trenches 222 and 1242 may be more readily achieved when the trenches 222 and 1242 are formed at different times. In another embodiment, insulating layer 322 can be replaced with an insulating layer within the trenches 222, 224, and 244 and a different insulating layer within the trenches 242. The insulating layers may have different compositions, different thicknesses, be formed using different techniques, another suitable difference or any combination thereof. In still another embodiment, portions of the source regions 622 may be removed from regions immediately adjacent to the trenches 242. Referring to FIG. 6, the masking layer (not illustrated) used when forming the source regions 602 can be modified so that the masking layer overlies portions of the workpiece adjacent to the trenches 242. The source regions 622 are still formed immediately adjacent to the trenches 222. The body regions 602 are formed at locations immediately adjacent to the primary surface and the trenches 242. In a further embodiment, within the active area, the locations of contact openings and conductive plugs 822 may be formed closer to the trenches 242 that include the conductive structures 342, as compared to the trenches 222 that include the gate members 542. After reading this specification, skilled artisans will understand that further embodiments may be used in accordance with the concepts described herein.

Figure 9:
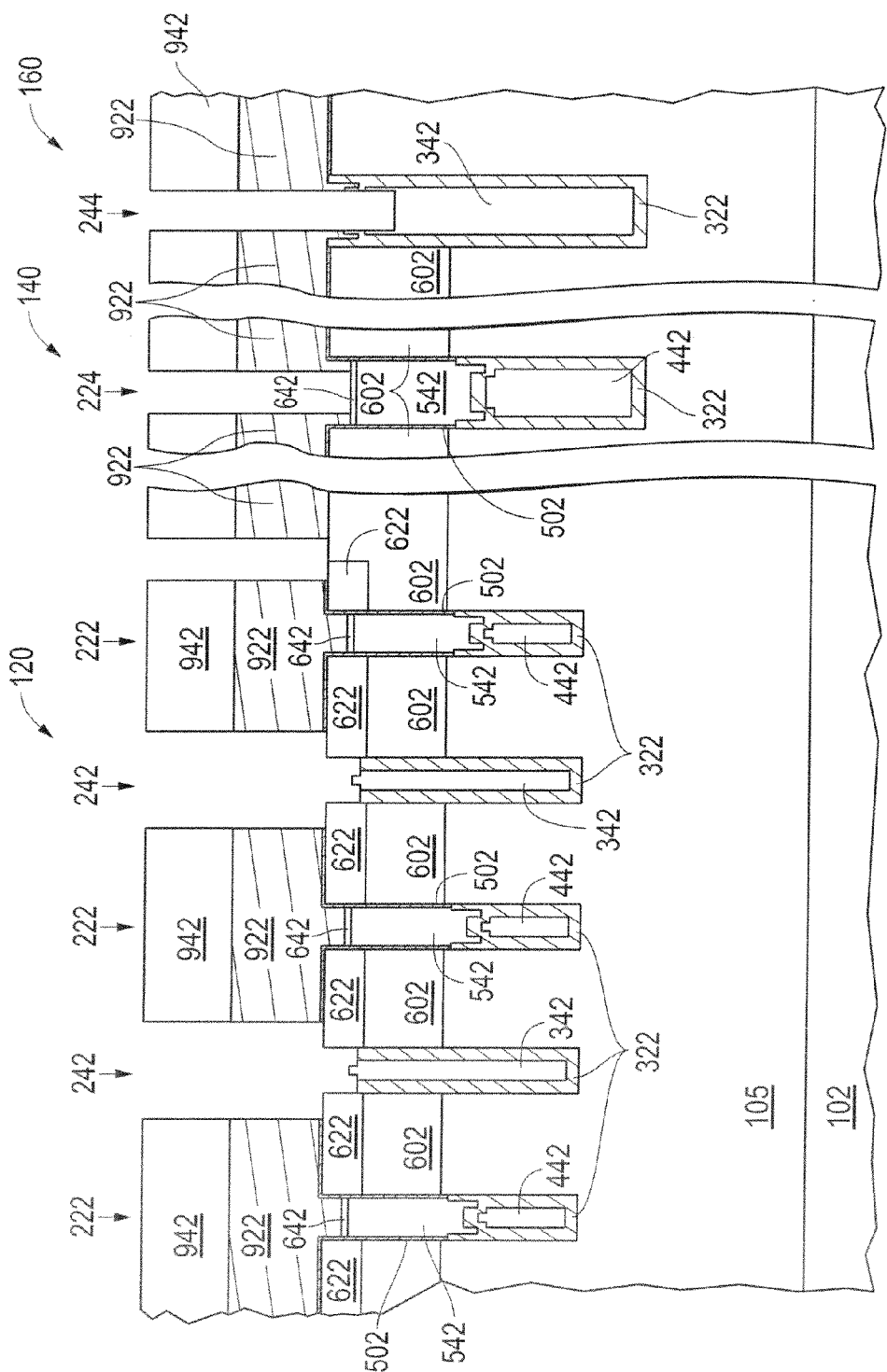
FIG. 9 includes an illustration of a cross-sectional view of the workpiece of FIG. 6 after forming an interlevel dielectric layer and contact openings in accordance with an alternative embodiment.

In another embodiment, contacts may be integrated to contact the conductive structures 342 within the active area. The processing for this particular embodiment can start with the workpiece as illustrated in FIG. 6. Referring to FIG. 9, an ILD layer 922 is formed over the workpiece and can include an oxide, a nitride, an oxynitride, or any combination thereof. The ILD layer 922 can include any of the materials, number of films, thicknesses, and formation techniques as described with respect to the ILD layer 722. The ILD layer 922 is patterned using masking layer 942 to define to define contact openings that extend through the ILD layer 922. Within the active area, the gate dielectric layer 502 and insulating stubs 422 (not illustrated in FIG. 9) of the insulating layer 322 are removed from the trenches 242 and from over portions of the source regions 622 adjacent to the trenches 242. At this point in the process, portions of the source regions 622 and the conductive structures 342 adjacent to or within the trenches 242 are exposed. Also, a portion of the conductive structure 342 within the trench 244 in the conductive electrode contact area is exposed.

Figure 10:
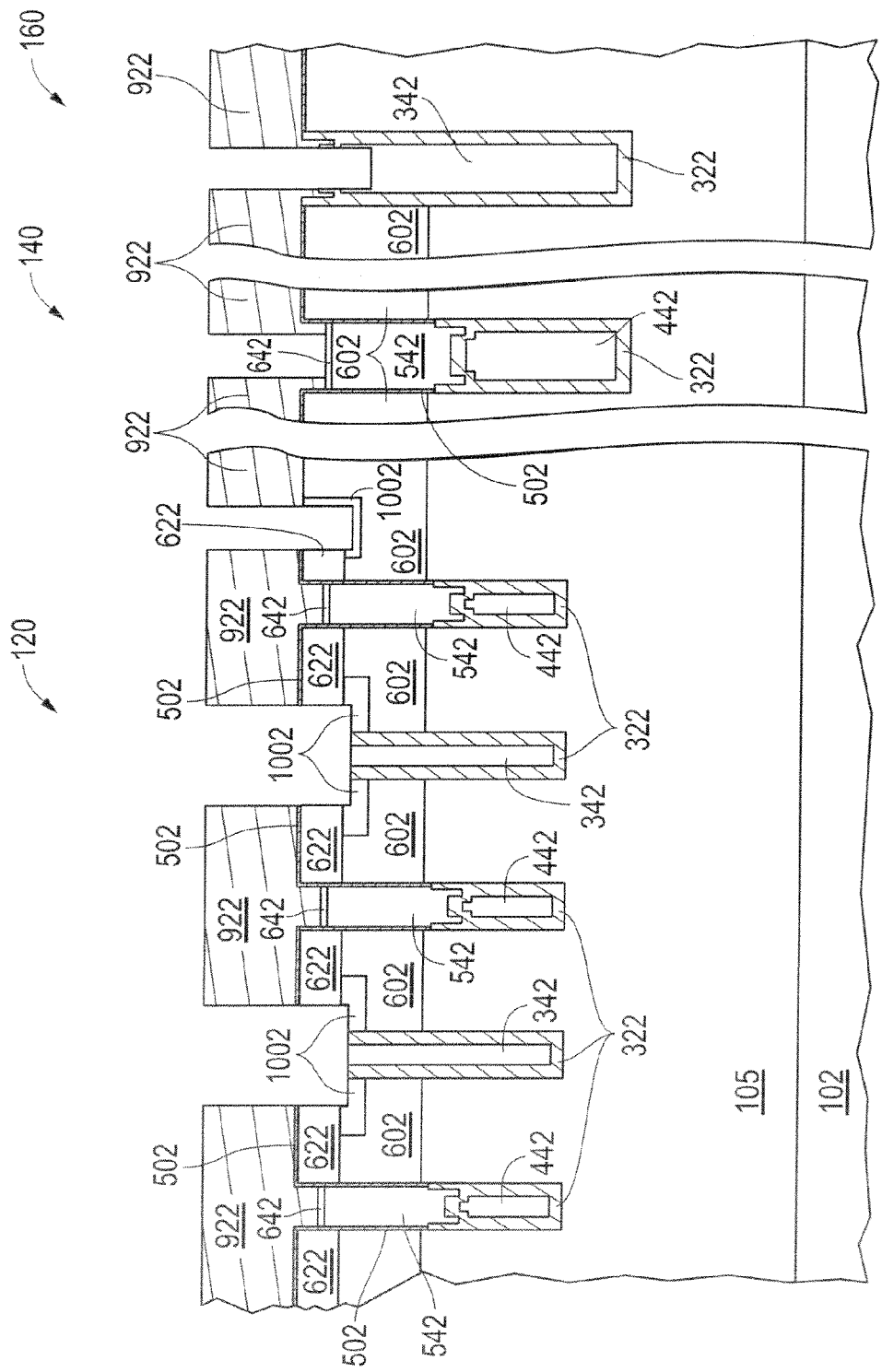
FIG. 10 includes an illustration of a cross-sectional view of the workpiece of FIG. 9 after removing portions of source regions, conductive structures, and forming body contact regions in accordance with the alternative embodiment.

Referring to FIG. 10, an etch is performed to extend the contact openings though exposed portions of the source regions 622 within the active area. The conductive structures 342 within the trenches 242 (active area) and trench 244 (conductive electrode contact area) are etched when the semiconductor layer 105 and conductive structure 342 include a similar material. For example, such conductive structures 342 may be etched when the semiconductor layer 105 includes mono crystalline silicon and the conductive structure 342 includes polycrystalline silicon. Such conductive structures 342 may not be etched when the conductive structure 342 includes tungsten. Within the gate feed area, the silicide region 642 can substantially prevent the underlying gate member from being etched. The etch can be performed as a timed etch or as an endpoint detected etch with a timed overetch. The first endpoint may be detected when the heavily doped source regions 622 become exposed, and a second endpoint may be detected by the presence of dopant from the body regions 602 in a particular embodiment. In the embodiment as illustrated, the contact openings are spaced apart from the trenches 222, and therefore, within the active area, the gate members 542 are not exposed within the contact openings.

Within the active area, the body contact regions 1002 are formed by doping the bottom part of the contact opening. The body contact regions 1002 may be implanted with a dopant having the same conductivity type as the body regions 602 in which they reside. The body contact regions 1002 are heavily doped so that ohmic contacts can be subsequently formed. If needed or desired, exposed portions of the regions, structures, and members may be silicided. The gate feed area and the conductive electrode feed area can be covered with resist when forming the body contact regions 1002, and the resist can be removed after the body contact regions 1002 are formed. Processing is continued to form a substantially-completed electronic device are previously described and illustrated in FIG. 8.

The embodiments as described and illustrated in FIGS. 9 and 10 may allow a smaller pitch to be achieved as compared to the embodiments as described and illustrated in FIGS. 1 to 8. When expressed as a multiple of design rules (such as the smallest feature size for the design rules or "F"), the cell pitch (gate-to-gate) can be taken from a range of approximately 8F to approximately 10F to a range of approximately 5.5F to approximately 6.5F. At 0.25 micron design rules, the cell pitch can be reduced from a range of approximately 2.0 micron to approximately 2.4 microns to a range of approximately 1.4 to approximately 1.6 microns. Further, the doping of the semiconductor layer 105 can be increased, which reduces $R_{DSON}$. The transistor structures in FIGS. 1 to 8 can have a lower $Q_G$ as compared to the transistor structures in FIGS. 9 and 10. Thus, the figure of merit (product of $Q_G$ and $R_{DSON}$) is approximately the same for both sets of the embodiments.

Alternative embodiments described with respect to FIGS. 1 to 8 may also be used for the embodiments as illustrated in FIGS. 9 and 10. In addition, the conductive structures under the contact openings may be formed later in the process. Referring to FIGS. 1 to 3, the trenches 222, 224, and 244 and the conductive structures 342 and 442 within the active, gate feed, and conductive electrode contact areas are formed using any of the embodiments as previously discussed. The trenches 242 and conductive electrodes 342 may be formed during the processing sequence used to form the contact opening and conductive plugs.

In particular, another masking layer (not illustrated) can be formed having a pattern corresponding to the trenches 242 as previously described. Contact openings may be etched through the ILD layer 942, and trenches may be formed that extend through the source regions 622 and partly, but not completely, through the body regions 602. Body contact regions are formed and diffused, so that such body contact regions extend laterally beyond the width of the contact openings. The trenches are then extended through the body contact regions, through remaining portions of the body regions 602, and into the semiconductor layer 105. At this point in the process, the trenches can be similar to any of the embodiments as described with respect to the trenches 242. An insulating layer and conductive structures can be formed within the trench, using any of the embodiments as described with respect to the insulating layer 322 and conductive structures 342. The conductive structures can be recessed so that the top of the conductive structures lie at an elevation within the body regions 602 or the body contact regions. The portions of the insulating layer lying at elevations above the conductive structures are removed.

The conductive plugs can then be formed. Each of the conductive plugs directly contacts and electrically connects the corresponding conductive structure, body contact region, and source region 622 to one another. The contact openings as described with respect to this embodiment may be narrower than those described with respect to FIGS. 9 and 10. The smaller contact openings can help to reduce the cell pitch. Further, the dimensions of trenches and compositions, thicknesses, or formation techniques for the insulating layer for this embodiment to be different from the trenches 222, 224, and 244, insulating layer 322, or any combination thereof. After reading this specification, skilled artisans will understand that further embodiments may be used in accordance with the concepts described herein.

As compared to conventional transistor structures, the electronic devices in accordance with the concepts as described herein provide a good compromise between figure of merit and die size. The electronic devices as described herein can have a lower $Q_G$ compared to conventional trench power MOSFETs, and thus, have a better figure of merit as compared to the conventional trench power MOSFETs. The transistor structures in electronic devices as described herein can have a significantly smaller size as compared to transistor structures in a conventional lateral power MOSFET. Thus, for the same effective channel width, an electronic device as described herein can be significantly smaller and may fit into a smaller package than an electronic device with conventional lateral power MOSFETs.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device including a transistor structure can include a patterned semiconductor layer overlying a substrate and having a primary surface, wherein the patterned semiconductor layer defines a first trench and a second trench that extend from the primary surface towards the substrate. The electronic device can further include a first conductive structure within the first trench, a gate electrode within the first trench and electrically insulated from the first conductive structure, and a second conductive structure within the second trench, wherein no gate electrode is disposed directly above the second conductive structure. The electronic device can still further include a source region within the patterned semiconductor layer and disposed between the first and second trenches, and a body contact region within the patterned semiconductor layer and between the first and second trenches, wherein the body contact region is spaced apart from the primary surface.

In an embodiment of the first aspect, from a cross sectional view, the source region is disposed along opposite sides of the first trench. In another embodiment, the body contact region is spaced apart from a sidewall of the second trench. In still another embodiment, the first and second trenches have substantially a same depth. In a further embodiment, the first trench is wider than the second trench. In yet a further embodiment, the first and second conductive structures are electrically connected to each other.

In a second aspect, a process of forming an electronic device can include providing a semiconductor layer overlying a substrate, wherein the semiconductor layer has a primary surface, and patterning the semiconductor layer to define a first trench and a second trench that extend from the primary surface towards the substrate. The process can also include forming a first conductive structure within the first trench, forming a second conductive structure within the second trench, forming a first insulating layer within the first trench after forming the first conductive structure, and forming a gate electrode within the first trench, wherein the first insulating layer is disposed between the gate electrode and the first conductive structure. The process can further include forming a body contact region within the patterned semiconductor layer and between the first and second trenches, wherein the body contact region is spaced apart from the primary surface. In a finished electronic device, no gate electrode may be disposed above the second conductive structure.

In an embodiment of the second aspect, the process further includes forming a second insulating layer within the first and second trenches before forming the first conductive structure and forming the second conductive structure. In another embodiment, forming the first conductive structure and forming the second conductive structure are performed such that at least portions of forming the first conductive structure and forming the second conductive structure are formed simultaneously during a same time period. In still another embodiment, patterning the semiconductor layer is performed such that the first and second trenches have substantially a same depth.

In a further embodiment of the second aspect, the process further includes forming an interlevel dielectric layer over the semiconductor layer, and patterning the interlevel dielectric layer to form a contact opening, wherein forming the body contact region is formed after patterning the interlevel dielectric layer. In a particular embodiment, the process further includes forming a source region within the patterned semiconductor layer and between the first and second trenches before forming the interlevel dielectric layer, and etching through the source region after patterning the interlevel dielectric layer, wherein forming the body contact region is formed after etching through the source region. In a more particular embodiment, the process further includes forming a conductive plug within the contact opening, wherein the conductive plug electrically connects the body contact region, the source region, and the second conductive structure to one another.

In yet a further embodiment of the second aspect, patterning the semiconductor layer defines additional first trenches and additional second trenches, wherein a ratio of a number of the first trenches to a number of the second trenches is approximately 1:1; and forming the gate electrode includes forming additional gate electrodes within the additional first trenches, wherein no gate electrodes are formed within the additional second trenches. In a particular embodiment, forming first conductive structures includes forming additional first conductive structures within the additional first trenches before forming the additional gate electrodes, and forming the second conductive structures includes forming additional second conductive structures within the additional second trenches. In a more particular embodiment, each of the second trenches includes a single second conductive structure and no other electrode.

In a third aspect, a process of forming an electronic device can include forming a semiconductor layer overlying a substrate, wherein the semiconductor layer has a primary surface, and patterning the semiconductor layer to define a first trench that extends from the primary surface towards the substrate. The process can further include forming a first conductive structure within the first trench, forming a first insulating layer within the first trench after forming the first conductive structure, forming a gate electrode within the first trench, wherein the first insulating layer is disposed between the gate electrode and the first conductive structure. The process can still further include patterning the semiconductor layer to define a second trench that extends from the primary surface towards the substrate, wherein patterning the semiconductor layer to define the second trench is performed after forming the gate electrode; and forming a second conductive structure within the second trench.

In an embodiment of the third embodiment, the process further includes forming an interlevel dielectric layer over the semiconductor layer, and patterning the interlevel dielectric layer to form a contact opening, wherein patterning the semiconductor layer to define the second trench is performed after patterning the interlevel dielectric layer. In a particular embodiment, the process further includes forming a body region within the semiconductor layer, wherein patterning the semiconductor layer to define the second trench is performed such that the second trench extends completely through the body region. In another particular embodiment, the process further includes forming an insulating layer along a bottom and a portion of the sidewall of the second trench before forming the second conductive structure, forming a body contact region, and forming a conductive plug within the contact opening and a portion of the second trench after forming the second conductive structure. The contact opening and the second trench can be substantially aligned to each other, and the conductive plug electrically connects the body contact region, the source region, and the second conductive structure to one another.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   providing a semiconductor layer overlying a substrate, wherein the semiconductor layer has a primary surface;
   patterning the semiconductor layer to define a first trench, a second trench, and a third trench that extend from the primary surface towards the substrate, wherein the first, second and third trenches are within an active region, and the third region is disposed between the first and second trenches;
   forming a first conductive structure within the first trench;
   forming a second conductive structure within the second trench;

forming a third conductive structure within the third trench;

forming a first insulating layer within the first trench after forming the first conductive structure;

forming a second insulating layer within the second trench after forming the second conductive layer;

forming a first gate electrode within the first trench, wherein the first insulating layer is disposed between the gate electrode and the first conductive structure; and forming a second gate electrode within the second trench, wherein the second insulating layer is disposed between the gate electrode and the first conductive structure, wherein in a finished electronic device, no gate electrode is disposed above the third conductive structure.

2. The process of claim 1, further comprising forming a second insulating layer within the first and second trenches before forming the first conductive structure and forming the second conductive structure.

3. The process of claim 1, wherein forming the first conductive structure and forming the second conductive structure are performed such that at least portions of forming the first conductive structure and forming the second conductive structure are formed simultaneously during a same time period.

4. The process of claim 1, wherein patterning the semiconductor layer is performed such that the first and second trenches have substantially a same depth.

5. The process of claim 1, further comprising:
forming an interlevel dielectric layer over the semiconductor layer; and
patterning the interlevel dielectric layer to form a contact opening,
forming a body contact region within the patterned semiconductor layer and between the first and second trenches, wherein the body contact region is spaced apart from the primary surface, and forming the body contact region is formed after patterning the interlevel dielectric layer.

6. The process of claim 5, further comprising:
forming a source region within the patterned semiconductor layer and between the first and second trenches before forming the interlevel dielectric layer; and
etching through the source region after patterning the interlevel dielectric layer,
wherein forming the body contact region is formed after etching through the source region.

7. The process of claim 6, further comprising forming a conductive plug within the contact opening, wherein the conductive plug electrically connects the body contact region, the source region, and the second conductive structure to one another.

8. The process of claim 1, wherein:
patterning the semiconductor layer defines additional first trenches and additional second trenches, wherein a ratio of a number of the first trenches to a number of the second trenches is approximately 1:1; and
forming the gate electrode comprises forming additional gate electrodes within the additional first trenches, wherein no gate electrodes are formed within the additional second trenches.

9. The process of claim 8, wherein:
forming first conductive structures comprises forming additional first conductive structures within the additional first trenches before forming the additional gate electrodes; and forming the second conductive structures comprises forming additional second conductive structures within the additional second trenches.

10. The process of claim 9, wherein each of the second trenches includes a single second conductive structure and no other electrode.

11. A process of forming an electronic device comprising:
providing a semiconductor layer overlying a substrate, wherein the semiconductor layer has a primary surface;
patterning the semiconductor layer to define a first trench that extends from the primary surface towards the substrate, wherein the first trench is disposed within an active region;
forming a first conductive structure within the first trench;
forming a first insulating layer within the first trench after forming the first conductive structure;
forming a gate electrode within the first trench, wherein the first insulating layer is disposed between the gate electrode and the first conductive structure;
patterning the semiconductor layer to define a second trench that extends from the primary surface towards the substrate, wherein patterning the semiconductor layer to define the second trench is performed after forming the gate electrode, and the second trench is disposed within the active region; and
forming a second conductive structure within the second trench.

12. The process of claim 11, further comprising:
forming an interlevel dielectric layer over the semiconductor layer; and
patterning the interlevel dielectric layer to form a contact opening,
wherein patterning the semiconductor layer to define the second trench is performed after patterning the interlevel dielectric layer.

13. The process of claim 12, further comprising forming a body region within the semiconductor layer, wherein patterning the semiconductor layer to define the second trench is performed such that the second trench extends completely through the body region.

14. The process of claim 13, further comprising:
forming an insulating layer along a bottom and a portion of the sidewall of the second trench before forming the second conductive structure;
forming a body contact region; and
forming a conductive plug within the contact opening and a portion of the second trench after forming the second conductive structure,
wherein:
the contact opening and the second trench are substantially aligned to each other; and
the conductive plug electrically connects the body contact region, the source region, and the second conductive structure to one another.

15. A process of forming an electronic device comprising:
providing a semiconductor layer overlying a substrate, wherein the semiconductor layer has a primary surface;
patterning the semiconductor layer to define a first trench and a second trench that are within an active region and extend from the primary surface towards the substrate;
forming a first insulating layer within the first trench;
forming a second insulating layer within the second trench;
forming a first conductive structure within the first trench, wherein the first insulating layer is disposed between the first conductive structure and the semiconductor layer;

forming a second conductive structure within the second trench, wherein the second insulating layer is disposed between the second conductive structure and the semiconductor layer;

forming a third insulating layer within the first trench after forming the first conductive structure;

forming a gate electrode within the first trench, wherein the third insulating layer is disposed between the gate electrode and the first conductive structure; and forming a body contact region within the patterned semiconductor layer and between the first and second trenches, wherein the body contact region is spaced apart from the primary surface, wherein in a finished electronic device, no gate electrode is disposed above the second conductive structure.

16. The process of claim 15, wherein the second trench includes a single second conductive structure and no other electrode.

17. The process of claim 15, wherein the second insulating layer electrically insulates the second conductive structure from the semiconductor layer.

18. The process of claim 15, wherein:

patterning the semiconductor layer defines additional first trenches and additional second trenches in the active region, wherein a ratio of a number of the first trenches to a number of the second trenches is approximately 1:1.

19. The process of claim 18, wherein:

forming first conductive structures comprises forming additional first conductive structures within the additional first trenches; and forming the second conductive structures comprises forming additional second conductive structures within the additional second trenches.

20. The process of claim 18, wherein:

forming the gate electrode comprises forming additional gate electrodes within the additional first trenches, wherein no gate electrodes are formed within the additional second trenches, and forming the additional gate electrodes are formed after forming the additional first conductive structures.

* * * * *